United States Patent [19]
Tanimura

[11] Patent Number: 5,790,385
[45] Date of Patent: Aug. 4, 1998

[54] ONE-CHIP ELECTRONIC COMPOSITE COMPONENT

[75] Inventor: Masanori Tanimura, Kyoto, Japan

[73] Assignee: Rohm Co., Ltd., Kyoto, Japan

[21] Appl. No.: 719,417

[22] Filed: Sep. 24, 1996

[30] Foreign Application Priority Data

Sep. 25, 1995 [JP] Japan ................. 7-246400

[51] Int. Cl.$^6$ ................................................. H05K 1/16
[52] U.S. Cl. .................. 361/766; 361/765; 338/195; 338/308; 338/256
[58] Field of Search ........................ 361/765, 766, 361/764; 338/195, 308, 256, 257

[56] References Cited

U.S. PATENT DOCUMENTS 4,460,938  7/1984  Clei ............................... 361/766
4,788,524  11/1988  Ozaki ............................ 338/195

*Primary Examiner*—Leo P. Picard
*Assistant Examiner*—John B. Vigushin
*Attorney, Agent, or Firm*—Nikaido, Marmelstein, Murray & Oram LLP

[57] ABSTRACT

Disclosed are a structure and a method of manufacture of a one-chip electronic composite component which is reduced of size while providing a resistance value properly adjusted. A resistor is formed on an insulator substrate. The resistor has a trimming groove by which a resistance value thereof is adjusted. An electronic element is in electrical connection with the resistor on the substrate. A protection layer covers at least the trimming groove. The resistor is disposed close to one side edge of the substrate with respect to a centerline extending lengthwise of the substrate. The trimming groove extends toward the one side edge of the substrate from a side defining the resistor remote from the one side edge of the substrate.

4 Claims, 3 Drawing Sheets

ONE-CHIP ELECTRONIC COMPOSITE COMPONENT

BACKGROUND OF THE INVENTION

This invention relates to a structure and a method of manufacture of a one-chip electronic composite component which has a resistor electrically connected with another electronic element, such as a capacitor, formed on an insulator substrate, wherein the resistor in the form of a layer is adjusted of resistance value by forming a trimming groove therein.

Chip resistors having a layer of resistance element on an insulator substrate are now in broad use. Chip resistors are inexpensively marketed, because they are available with large quantities at one time through a printing process on a large-sized divisible substrate. However, there is a tendency that the resistance value of a resistor printed on a substrate comes to deviation resulting from variations in thickness of a layer thereof and so on. To cope with this, a chip resistor once formed is usually adjusted of its resistance value by forming a trimming groove extending in a resistance element thereof while measuring the resistance value across the resistor. In the meanwhile, there is a demand for further compactness of chip resistors, together with integration with another electronic element such as a capacitor, as electronic devices and instruments become still more compact.

Under such situations, there existed are conventionally one-chip composite components involving a resistor and another electronic element formed on a single substrate chip, as shown in FIG. 5. The conventional one-chip composite component has a resistor and a capacitor formed on the surface of an insulator substrate 11. The substrate 11 has respective end electrodes 12, 13 formed at opposite ends of the substrate 11. The capacitor is formed by a lower electrode 14 formed on the substrate 11, a dielectric layer 15 formed overlying the lower electrode 14, and an upper electrode 16 formed on the dielectric layer 15 in electrical connection with the end electrode 13. On the other hand, the resistor is formed by a resistance element 17 connected at one end to the end electrode 12 and at the other end to the lower electrode 14 of the capacitor. Thus, the capacitor and the resistor are in connection in series between the end electrode 12, 13 on the single substrate chip 11, forming a one-chip composite component.

In the meanwhile, in order to adjust the resistance value of the resistance element to a desired target value, a trimming technique is utilized during manufacturing processes. Where a trimming groove is formed, e.g., by laser-trimming in the resistance element, the resistance value increases in commensurate with the length and direction of the groove. In the case of employing laser-trimming for an existing chip resistor, it is usual practice to forming a groove from one side (extending between the opposite end electrodes) toward the inner or transverse of the resistance element. In laser-trimming, a trimming-groove is formed by irradiation of a laser beam incident onto the resistance element, while measuring the resistance value with probes contacted with opposite electrodes of a chip resistor. In order to enhance the accuracy of laser-trimming, the groove is typically in a rectangular form, i.e., firstly trimming from one side of a resistance element for initial or rough adjustment and then doing in a lengthwise direction for final or finer adjustment.

SUMMARY OF THE INVENTION

It is therefore an object of the present invention to provide a one-chip electronic composite component which is reduced of size while providing a resistance value properly adjusted.

It is another object of the present invention to provide a position from which a trimming groove is formed in a resistor for a composite component.

It is a further object of the present invention to provide a method of manufacturing a one-chip electronic composite component involving steps wherein the resistance value is adjusted with higher accuracy.

In accordance with a first aspect of the present invention, there is provided a one-chip electronic composite component comprising:

an insulator substrate;

a resistor formed on the substrate, the resistor has a trimming groove by which a resistance value thereof is adjusted;

an electronic element formed in electrical connection with the resistor on the substrate;

a protection layer formed to cover at least the trimming groove;

wherein the resistor is disposed close to one side edge of the substrate with respect to a centerline extending lengthwise of the substrate, and the trimming groove extends toward the one side edge of the substrate from a side defining the resistor remote from the one side edge of the substrate.

Accordingly, if the protection layer be printed with registration somewhat or slightly out of the position, there is almost no possibility of exposure of the trimming groove from the protection layer. Therefore, the structure of the present invention can well cope with the problem encountered in miniaturization of the composite component, providing reliability on resistance value, etc. for the composite component.

Preferably, the one-chip electronic composite component further comprising an electrode pad electrically connected with the connecting portion of between the resistor and the electronic element, and the trimming groove extends toward the substrate one side edge from a point in the side defining the resistor close to the electrode pad.

With such arrangement, laser-trimming is started from a point close to or spaced by a certain amount from the electrode pad. The electrode pad may be provided higher in brightness relative to that of the substrate due to difference of reflectivity therebetween, providing clear contrast in brightness, when an image is taken by the camera. This facilitates acknowledgment of the electrode pad and hence determination of starting point for laser-trimming, thereby enhancing efficiency of laser-trimming particularly for multiplicity of resistance elements provided throughout the undivided substrate.

The electronic element may be a capacitor having a lower electrode formed on the substrate, a dielectric layer formed overlying the lower electrode, and an upper electrode formed on the dielectric layer.

The trimming groove may extend perpendicular to the lengthwise of the resistor and turns at a tip portion thereof to the lengthwise direction.

In accordance with a second aspect of the present invention, there is also provided a method of manufacturing a one-chip electronic composite component comprising the steps of:

preparing an insulator substrate;

forming electrodes by printing a paste material for conductors on the substrate and burning the substrate;

forming one of a resistor and another electronic element by utilizing the electrodes and then forming the other of the resistor and the electronic element, the resistor being positioned close to one side edge of the substrate with respect to a centerline extending lengthwise of the substrate;

forming a trimming groove extending toward the one side edge of the substrate from a side defining the resistor remote from the one side edge of the substrate; and forming a protection layer so as to cover at least the trimming groove.

Thus, the trimming groove can be formed from the closer side of the resistance element to the electrode pad. Accordingly, if the protection layer be printed with registration somewhat or slightly out of the position, there is almost no possibility of exposure of the trimming groove from the protection layer, eliminating the fear of exposure of the trimming groove to an external environment and enhance productivity for composite components.

Preferably, the electrode formation step involves formation of an electrode pad electrically connected with the connecting portion of between the resistor and the electronic element, and the trimming groove forming step is performed such that the trimming groove extends toward the substrate one side edge from a point in the side defining the resistor close to the electrode pad.

Laser-trimming is started from a point close to or spaced by a certain amount from the corner of the electrode pad, thereby enhancing efficiency of laser-trimming particularly for multiplicity of resistance elements provided throughout the undivided substrate.

The trimming groove may be formed such that the trimming groove extends perpendicular to the lengthwise of the resistor and turns at a tip portion thereof to the lengthwise direction.

DETAILED DESCRIPTION

Figure 1:
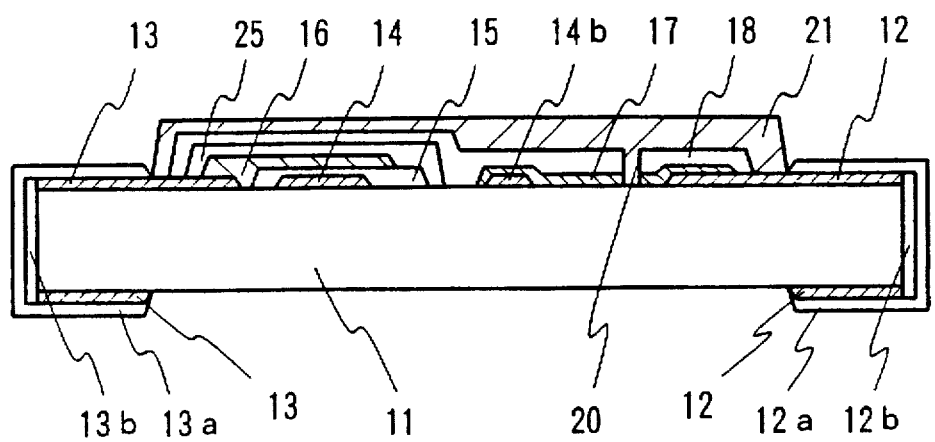
FIG. 1 is a longitudinal sectional view of a onechip electronic composite component according to one embodiment of the present invention.

First referring to FIG. 1, there is illustrated a sectional view of a composite electronic component structure according to one embodiment of the present invention. The composite component has a resistor and a capacitor provided in series between opposite end electrodes 12, 13 formed on both ends of an insulator substrate 11.

The resistor is formed by a resistance element 17 which is formed of, e.g., ruthenium oxide. The resistance element 17 has one end electrically connected with one end electrode 12 and the other end electrically connected with an intermediate electrode 14b continuous with a lower electrode 14 for the capacitor, providing connection in series between the resistor and the capacitor. The capacitor has a lower electrode 14, a dielectric layer 15 formed over the lower electrode 14, and an upper electrode 16 formed overlying the dielectric layer 15. The upper electrode 16 is formed continuous with or connected to the other end electrode 13. Thus, the capacitor is defined by an area of the dielectric layer 15 sandwiched between the lower electrode 14 and the upper electrodes 16.

The resistance element 17 has a trimming groove 20 for adjusting a resistance value of the resistance element 17 to an appropriate value. The trimming groove 20 is formed by a laser-trimming technique, stated later. The lower electrode 14 has an electrode pad 14a (best shown in FIG. 3) extending therefrom. The electrode pad 14a serve as an electrode in cooperation with the end electrode 12 in measuring a resistance value of the resistance element 17 while the trimming groove is being formed by laser-trimming.

The end electrodes 12, 13 respectively extend through end faces of the substrate 11 to the underside of the substrate 11, for facilitating surface-mounting of the composite component on a mother board, not shown, through e.g., soldering. These end electrodes 12, 13 each have a surface layer 12a, 13a formed by an inner Ni electroplating layer and an outer solder layer for enhancing solderability.

The capacitor is covered by a first glass layer 25 formed by a dielectric glass, etc. Further, the capacitor and the resistor are commonly covered by a second glass layer 18. The second glass layer 18 helps prevent metal parts such as electrode pad 14a and end electrode 12 from contaminating with contaminants produced during laser-trimming. Further, an outermost protection layer 21 is formed of, e.g., an epoxy resin so as to cover almost the entire surface of the substrate 11, except for opposite end areas. The protection layer 21 is provided after carrying out of laser trimming to protect various portions including trimming groove 20 from external environment.

Figure 3:
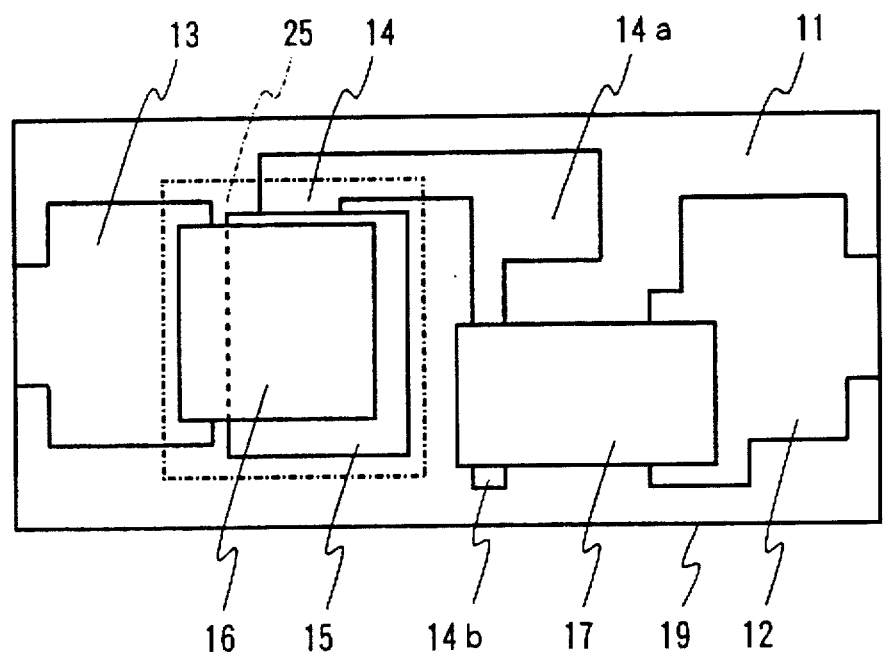
FIG. 3 is a plan view similar to FIG. 2, showing a process of forming a resistor after formation of a capacitor.

The resistance element 17 is provided asymmetrical, as viewed in plan of FIG. 3, relative to a lengthwise center line of the substrate 11. That is, the resistance element 17 is positioned close to one side edge of the substrate 11, so that the electrode pad 14a is laid out juxtaposed with the resistance element 17 on the substrate 11.

With such a structure, the resistance value of the resistance element 17 is to be increased by providing a trimming groove 20. This is because the electric current flowing through the resistance element 17 is restricted by the presence of the trimming groove 20. As conventionally known, the trimming groove 20 may be formed by irradiation of a laser beam incident on the resistance element 17, so that part of the resistance element 17 is removed off or trimmed away, thereby increasing the resistance value of the resistance element 17. In laser-trimming, provided that the intensity or energy of the laser beam and the moving rate thereof are constant, the rate of increase of the resistance is commensurate with the length and the direction of the trimming groove 20. In case where the trimming groove 20 is in a direction transverse to the lengthwise of the resistance element 17, the resulting resistance value for the resistance element 17 significantly increases, whereas it is in the direction parallel to the resistance element 17, the increase of the resistance value is comparatively small. In practice, the trimming groove is formed in a rectangular form, i.e., firstly formed from one side of the resistance element 17 toward the inward or transverse thereof for initial or rough adjustment, and then turned to a lengthwise direction for final or finer adjustment.

In the meanwhile, during laser-trimming gasses or contaminants are produced which are possibly scattered to cause contamination in electrode portions such as the electrode pad 14a or the end electrode 12. In the present invention, however, the presence of the second glass layer 18 covering the resistance element 17 helps prevent contaminants to scatter or adhere to other electrode portions, etc.

In the present invention, the point from which the trimming groove 20 is formed is the side defining the resistance element 17 close to the electrode pad 14a, because of the reason given below. As stated above, the resistance element have to be laid out close to one side edge of the substrate 11 with electrode pad juxtaposed therewith, in order to realize efficient lay-out for both the resistor and the capacitor on a single substrate 11. Further, the resistance element 17 usually has a small width of as small as, e.g., 0.5 mm. To this end, the margin given between the resistance element 17 and the nearing side edge of the substrate 11 has to be limited to, e.g., 0.25 mm.

In the meanwhile, there is inevitably encountered misalignment during formation through printing of the protection layer 21. With a small margin between the resistance element 17 and the side edge of the substrate 11, where a trimming groove is formed from a side of the resistance element 17 remote from the electrode pad 14a, if the protection layer be printed slightly or somewhat out of registration, i.e., toward the inward of the substrate 11, the resulting trimming groove will be exposed from the protection layer. Such exposure of the trimming groove will induce intrusion of an electroplating solution during an electroplating process subsequently performed. The exposure of the trimming groove also may introduce moisture therethrough, in actual servicing during usage. The electroplating solution or moisture thus involved possibly incurs deterioration in resistance characteristic, etc., degrading the quality of the composite component. Thus, there is a problem of exposure of the trimming groove which may lead to intrusion of electroplating solution or moisture, as long as laser-trimming is made starting from the side remote from the electrode pad 14a.

In the present invention, however, the trimming groove 20 is formed from the closer side of the resistance element 17 to the electrode pad 14a. Accordingly, if the protection layer 21 be printed with registration somewhat or slightly out of the position, there is almost no possibility of exposure of the trimming groove 20 from the protection layer 21. It is noted that the resistance element 17 is covered by the second glass layer 18 prior to the formation of the outermost protection layer 21, further lessening the possibility of exposure of the trimming groove 20. Therefore, the structure according to the present invention can well cope with the problem encountered in miniaturization of the composite component, providing reliability on resistance value, etc. for the composite component.

A method of manufacturing a one-chip electronic composite component is then explained hereinbelow.

Figure 2:
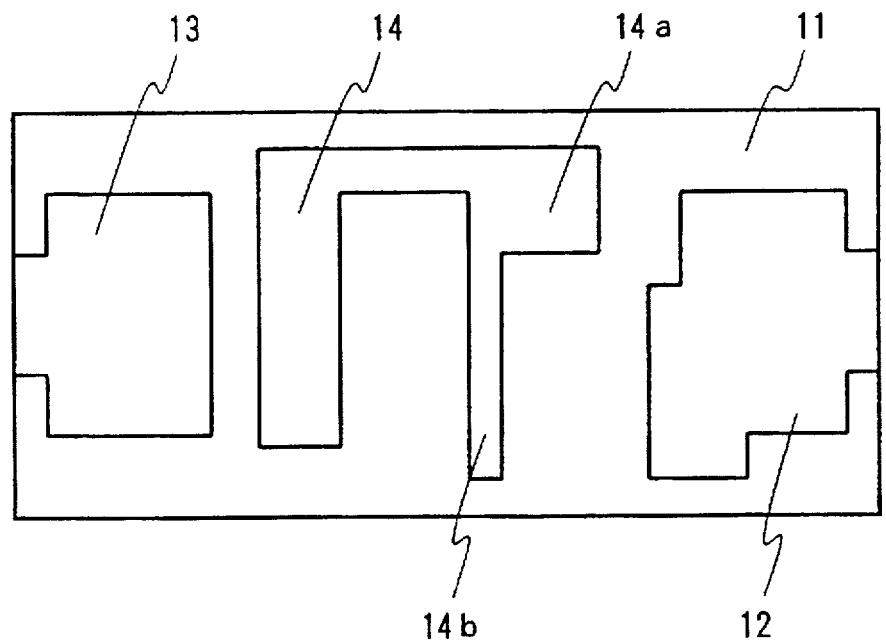
FIG. 2 is a plan view of the composite component of FIG. 1, showing a process of forming electrodes on an insulator substrate.

Referring to FIG. 2, an divisible large-sized substrate of alumina ceramics is first prepared, in order to manufacture at one time a multiplicity of discrete composite components. The substrate has a number of slits formed in a lattice form so that it is readily broken along the slits into individual parts or unit areas, as stated later. It is noted in FIG. 2 that only one unit area is shown for simplifying explanation. The substrate is first printed with a paste material containing silver and palladium in given areas of the upper and lower surfaces thereof. The printed substrate is burnt to form electrodes such as opposite end electrodes 12, 13, a lower electrode 14 for a capacitor and an intermediate electrode 14b and an electrode pad 14a both continuous with the lower electrode 14. However, the end electrode 12, 13 will be completed after providing connection through a lateral side face of the substrate 11 using a conductive resin, as explained later. After forming these electrodes, a paste material of containing barium titanate is printed on the surface of the lower electrode 14. Then, the substrate thus printed is burnt to form a capacitor dielectric layer 15 overlying the lower electrode 14, as shown in FIG. 3. Thereafter, a silver-and-palladium contained paste material is printed on the dielectric layer 15 in a manner of bridging to the end electrode 13, and burnt to form an upper electrode 16 for a capacitor, followed by being burnt. Thus, a capacitor is provided by the lower and upper electrodes 14, 16 and the dielectric layer 15 sandwiched therebetween.

After formation of the capacitor, a first glass layer 25 is formed by printing and burning to cover the capacitor. The first glass layer 25 is of a two-layered structure formed by an inner dielectric glass layer and an outer alumina-silicate glass layer.

Thereafter, a resistance element 17 is formed by printing and burning of a paste material containing ruthenium oxide, which bridges between the end electrode 12 and the intermediate electrode 14, thereby providing a resistor. The resistance element 17 may be of a size, e.g., having a length of 0.85 mm by a width of 0.5 mm with a thickness of 10 μm.

Figure 4:
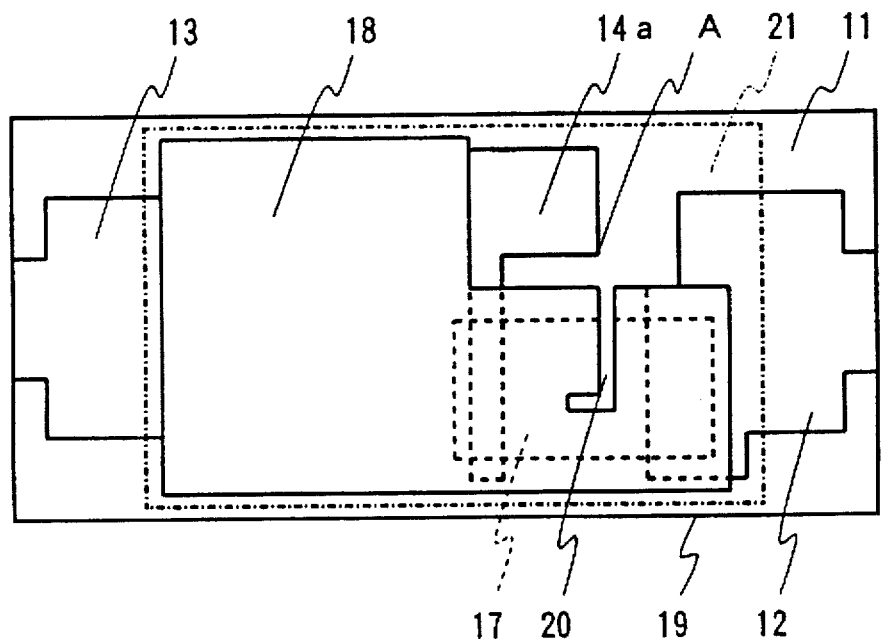
FIG. 4 is a plan view similar to FIG. 3, showing a process of forming a trimming groove relative in position to other elements for the composite component.
Figure 5:
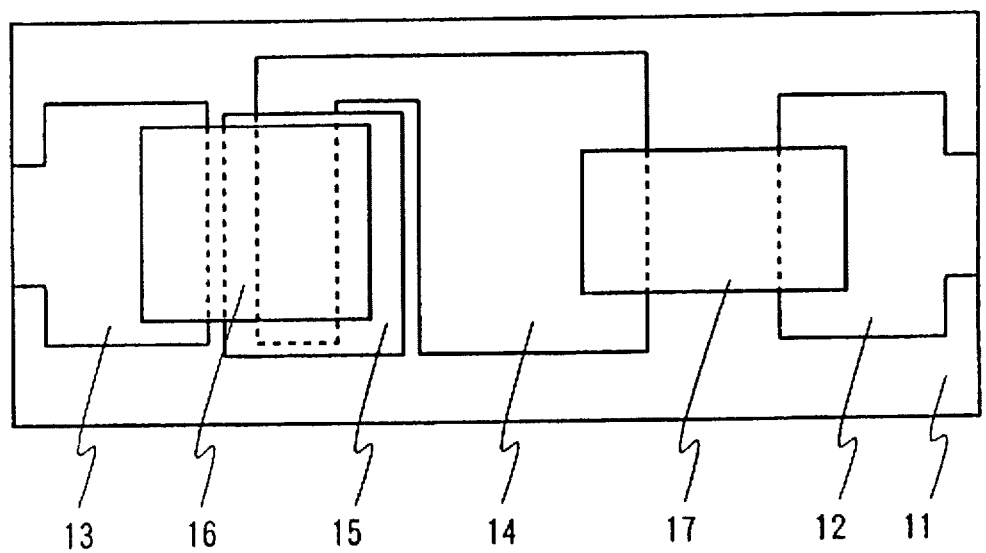
FIG. 5 is a plan view of a conventional composite component, showing arrangement of various elements.

Referring to FIG. 4, after forming the resistance element 17, a second glass layer 18 is formed of borosilicate-lead glass so as to cover the resistor together with the capacitor already coated with the first glass layer 25. The second glass layer 18 covers commonly the resistor and the capacitor excepting an area of the electrode pad 14a, so that the electrode pad 14a is used, together with the end electrode 12, for measuring a resistance value of the resistance element during laser-trimming performed later Thereafter, the resistance element 17 is subjected to laser-trimming. To carry out laser-trimming, the substrate still undivided is placed on a laser-trimmer such that the corner A as a reference position of the electrode pad 14a can be acknowledged by a camera for processing of data information based on an image thereof. Laser-trimming is started from a point close to or spaced by a certain amount from the corner A of the electrode pad 14a. It is noted that the electrode pad 14a is higher in brightness relative to that of the substrate 11 due to difference of reflectivity therebetween, providing clear contrast in brightness, when an image is taken by the camera. This facilitates acknowledgment of the corner A and determination of starting point for laser-trimming, thereby enhancing efficiency of laser-trimming particularly for multiplicity of resistance elements 17 provided throughout the undivided substrate.

The laser-trimming is performed by moving the laser beam along a direction traversing the resistance element 17 to a given point from which it is then turned to a lengthwise direction of the resistance element 17, thereby providing a rectangularly formed trimming groove 20. Such laser-trimming is carried out while measuring the resistance value of the resistance element 17 with using probes, not shown, contacted with the end electrode 12 and the electrode pad 14a. The transverse-direction portion of the trimming groove 20 is for rough adjustment, i.e., for increasing the resistance value up to immediately before reaching a target value, whereas the lengthwise portion is for fine adjustment of achieving the target value. With such laser-trimming, the resistance element is adjusted by increasing its resistance value to a desired target value.

After carrying out the laser-trimming, a protection layer 21 is provided to cover over the entire surface of the substrate except for surface areas of the opposite end portions of the substrate 11. To form the protection layer 21, an epoxy resin is applied by printing onto the surface of the substrate 11 and then cured. The protection layer 21 is entirely formed over the substrate 11 so that it positively cover the trimming groove 20, protecting the various portions including the trimming groove 20 from external environment. On this occasion, the trimming groove 20 is positioned inward of the substrate 11, it is positively covered by the protection layer 20, without fear of exposure therefrom.

Then, the substrate is divided into bar-formed substrates, not shown, by the use of a breaker along each slit extending between the end electrodes 12, 13. Each bar-form substrate is applied at its opposite side faces with an electrically-conductive resin so as to bridge between associated end electrodes 12, 13 on the upper and lower surfaces, providing lateral portions 12b, 13b for respective end electrodes 12, 13 (See FIG. 1). By curing the conductive resin, end electrodes each extend through an end face to the underside of the substrate. Thereafter, the bar-formed substrate is further divided into a plurality of chip substrate. The divided substrates are subjected to electroplating to form an electroplating layer 12a, 13a over each end electrode 12, 13. The electroplating layer is preferably provided by an inner Ni layer and an outer solder layer. Thus, provided are one-chip electronic composite components according to the present invention.

Although, in the above embodiment, the trimming groove was provided solely for the resistor, the capacitor may also be adjusted of its capacitance value by similarly forming a trimming groove from the above.

Further, the composite component was constituted by the resistor and the capacitor, but the present invention is not limited to such a structure. It may alternatively be formed by a combination with one or more other electronic elements, e.g., a resistor and an inductance element.

The present invention is never limited to the above embodiment as to materials used or a way of manufacture. The electrode pad may not necessarily be provided close to the resistor.

What is claimed is:

1. A one-chip electronic composite component comprising:

an insulator substrate;

a resistor formed on said substrate, said resistor has a trimming groove by which a resistance value thereof is adjusted;

an intermediate electrode formed on said insulating substrate and connected to one end portion of said resistor;

an electrode pad provided in electrical connection with said intermediate electrode on said insulating substrate;

a lower electrode provided in electrical connection with said electrode pad and said intermediate electrode;

an electronic element provided on said lower electrode having one end portion in connection therewith; and a protection layer formed to cover at least said trimming groove;

wherein said resistor is disposed close to one side edge of said substrate with respect to a centerline extending lengthwise of said substrate, and said trimming groove extends toward said one side edge of said substrate from a side defining said resistor remote from said one side edge of said substrate.

2. The one-chip electronic composite component of claim 1, wherein said electronic element is a capacitor having said lower electrode formed on said substrate, a dielectric layer formed overlying said lower electrode, and an upper electrode formed on said dielectric layer.

3. The one-chip electronic composite component of claim 1, wherein said trimming groove extends perpendicular to the lengthwise direction of said resistor and turns at a tip portion thereof to the lengthwise direction.

4. A one chip electronic composite component comprising:

an insulator substrate;

a resistor formed on said substrate, said resistor has a trimming groove by which a resistance value thereof is adjusted;

an electronic element formed in electrical connection with said resistor on said substrate; and a protection layer formed to cover at least said trimming groove;

wherein said resistor is disposed close to one side edge of said substrate with respect to a centerline extending lengthwise of said substrate, and said trimming groove extends toward said one side edge of said substrate from a side defining said resistor remote from said one side edge of said substrate; and an electrode pad electrically connected with a connecting portion of said resistor and said electronic element, and said trimming groove extends toward said substrate one side edge from a point in said side defining said resistor close to said electrode pad.

* * * * *